(12) United States Patent
Zojer

(10) Patent No.: US 9,998,110 B2
(45) Date of Patent: Jun. 12, 2018

(54) SYSTEM AND METHOD FOR VARIABLE IMPEDANCE GATE DRIVER

(71) Applicant: Infineon Technologies Austria AG, Villach (AT)

(72) Inventor: Bernhard Zojer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 41 days.

(21) Appl. No.: 15/344,316

(22) Filed: Nov. 4, 2016

(65) Prior Publication Data

US 2018/0131365 A1   May 10, 2018

(51) Int. Cl.
  *H03K 17/687*   (2006.01)
  *H03K 17/16*   (2006.01)
(52) U.S. Cl.
  CPC .................. *H03K 17/162* (2013.01)
(58) Field of Classification Search
  None
  See application file for complete search history.

(56) References Cited

U.S. PATENT DOCUMENTS

2016/0233859 A1 *  8/2016  Roberts ............ H03K 17/04123
2017/0179944 A1 *  6/2017  Ngo ..................... H03K 17/165

OTHER PUBLICATIONS

Balogh, L., "Design and Application Guide for High Speed MOSFET Gate Drive Circuits," Texas Instruments/Unitrode Corporation, Power Supply Design Seminar, SEM, 2001, pp. 1-37.

* cited by examiner

Primary Examiner — Long Nguyen
(74) Attorney, Agent, or Firm — Slater Matsil, LLP

(57) ABSTRACT

In accordance with an embodiment, a circuit including: a gate driver coupled to a first supply terminal and to an output terminal, the output terminal configured to be coupled to a gate of a switching transistor via an inductive element, the gate driver configured to receive a switching signal; provide a first gate activation voltage at the output terminal with a first output resistance when the switching signal transitions from a first state to a second state; provide the first gate activation voltage at the output terminal with a second output resistance after a first time of providing the first gate activation voltage at the output terminal with the first output resistance, the second output resistance being larger than the first output resistance; and provide a first gate deactivation voltage at the output terminal when the switching signal transitions from the second state to the first state.

23 Claims, 13 Drawing Sheets

PRIOR ART

PRIOR ART

PRIOR ART

US 9,998,110 B2

SYSTEM AND METHOD FOR VARIABLE IMPEDANCE GATE DRIVER

TECHNICAL FIELD

The present disclosure relates generally to an electronic device, and more particularly to a gate drive concept for power switches with common source inductance.

BACKGROUND

Switch-mode circuits, including switch-mode power supplies and motor controllers, are pervasive in many electronic applications from computers to automobiles. Generally, voltages within a switched-mode power supply system are generated by performing a DC-DC, DC-AC, and/or AC-DC conversion by operating a switch coupled to an inductor or a transformer. Switch-mode power supplies are usually more efficient than other types of power conversion systems because power conversion is performed by controlled charging and discharging a low loss component, such as an inductor or transformer, therefore reducing the energy lost due to power dissipation in resistive components. Similarly, switch-mode motor controllers may be used to efficiently commutate DC brushless motors with low losses in the driving circuitry.

With respect to implementing a switch-mode circuit, specialized driving circuitry is used to efficiently drive a switching transistor coupled to the various magnetic components. Such circuitry may be configured to provide switching signals at appropriate speeds and voltage levels. These voltage levels may be established, for example, by using external DC supply voltages, voltage regulators, level shifters, charge pumps and other circuits to ensure that the switching transistor is turned-on and off. In addition to establishing appropriate voltage levels, switching transistor driving circuits may also be designed to mitigate the effects of voltage transients caused by the fast switching of inductive loads. Such effects may include, for example, voltage overshoot seen at the switching transistor and/or the ringing or oscillations due to stray inductance and parasitic capacitance.

SUMMARY

In accordance with an embodiment, a circuit including: a gate driver coupled to a first supply terminal and to an output terminal, the output terminal configured to be coupled to a gate of a switching transistor via an inductive element, the gate driver configured to receive a switching signal; provide a first gate activation voltage at the output terminal with a first output resistance when the switching signal transitions from a first state to a second state; provide the first gate activation voltage at the output terminal with a second output resistance after a first time of providing the first gate activation voltage at the output terminal with the first output resistance, the second output resistance being larger than the first output resistance; and provide a first gate deactivation voltage at the output terminal when the switching signal transitions from the second state to the first state.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a gate drive circuit configured to drive a power metal oxide semiconductor field effect transistor (MOSFET) with a common source inductance in various circuit topologies. A common source inductance is a source inductance common to both gate-source and drain-source current loops. Embodiments of the present invention may also be applied to other types of transistors and other circuit topologies. For example, other transistor types such as Junction FET (JFET), Insulated Gate Bipolar transistor (IGBT), High Electron Mobility Transistor (HEMT) may be used.

In an embodiment of the present invention, a gate inductance is added to the gate of a power switch. A gate drive circuit has an adjustable resistance such that during certain phases of a power MOSFET transition, an inductive drive is used to quickly charge or discharge the gate of the power MOSFET. During other phases of a power MOSFET transition, a higher resistive drive is used to prevent ringing and overshoot.

A power MOSFET is a type of MOSFET capable of handling significant amounts of power. A power MOSFET may be implemented as a discrete device, or may be integrated with other components into an integrated circuit.

Figure 1A:
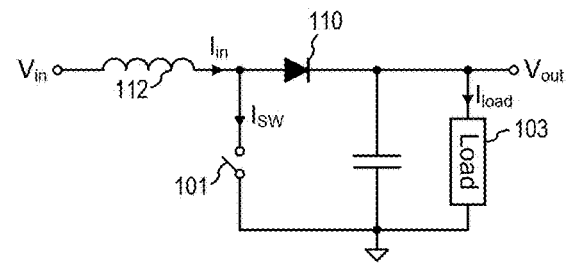
FIG. 1a shows an exemplary converter in boost configuration.

Switch-mode power supply (SMPS) systems may be implemented in different topologies. For example, FIG. 1a shows an exemplary converter in boost configuration. The exemplary boost converter of FIG. 1a may be configured to deliver to load 103 an output voltage $V_{out}$ that is typically higher than an input voltage $V_{in}$. The exemplary boost converter of FIG. 1a includes switch 101, inductor 112, and free-wheeling diode 110.

During normal operation, switch 101 turns on and off, causing input current $I_{in}$ to alternately flow through switch 101 and free-wheeling diode 110. Specifically, when switch 101 is closed, switching current $I_{SW}$ increase, thereby charging inductor 112. When switch 101 turns off, input current $I_{in}$ flows through free-wheeling diode 110 increasing output voltage $V_{out}$. The process may be controlled in closed loop to achieve a particular output voltage $V_{out}$ in any way known in the art. Other implementations of the exemplary boost converter are also possible.

Figure 1B:
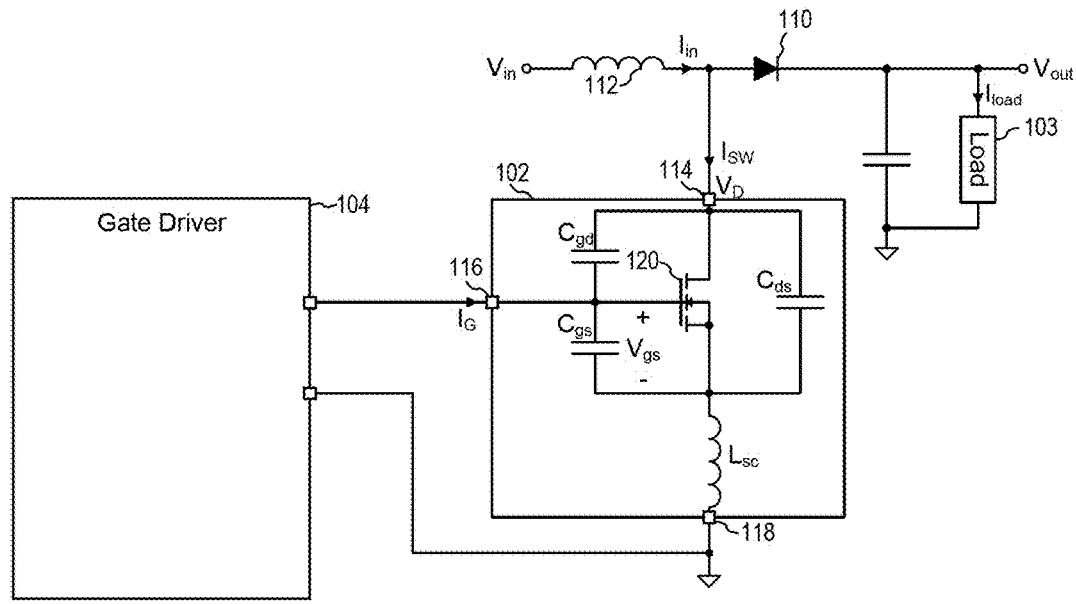
FIG. 1b illustrates a system with an exemplary power MOSFET and a gate drive circuit in boost configuration.

SMPS systems in general, and SMPS systems implementing power MOSFETs in particular, typically attempt to maximize efficiency while satisfying other design considerations. The efficiency of an SMPS system may be influenced by the dynamics of the switching process, which are related, in part, to the parasitic elements of the SMPS system, including the parasitic elements of the power MOSFET. FIG. 1b illustrates a system with an exemplary power MOSFET and a gate drive circuit in a boost configuration including gate driver circuit 104, power MOSFET 102, inductor 112, and free-wheeling diode 110. Power MOSFET 102 is represented in FIG. 1b with a model that includes parasitic gate-to-drain capacitance $C_{gd}$, parasitic gate-to-source capacitance $C_{gs}$, parasitic drain-to-source capacitance $C_{ds}$, and parasitic common source inductance $L_{sc}$. As shown in FIG. 1b, parasitic common source inductance $L_{sc}$ is common to gate and drain loop, i.e. both the gate current $I_G$ and the switching current $I_{sw}$ have to flow through $L_{sc}$.

During normal operation, gate drive circuit 104 controls a voltage between gate terminal 116 and source terminal 118 to turn on and off power MOSFET 102, causing input current $I_{in}$ to alternately flow through a channel, also known as a load path, of the power MOSFET 102 and free-wheeling diode 110. Thus the current flowing through parasitic common source inductance $L_{sc}$ changes and a voltage drop $V_{LSC}$ across parasitic common source inductance $L_{sc}$ may develop. Voltage drop $V_{LSC}$ may influence gate drive circuit 104 in a way that counteracts the change in current through $L_{sc}$. This behavior may increase transition times and switching losses, particularly in high current applications requiring tens of amps and operating at high switching frequencies, such as above 100 kHz.

Figure 1C:
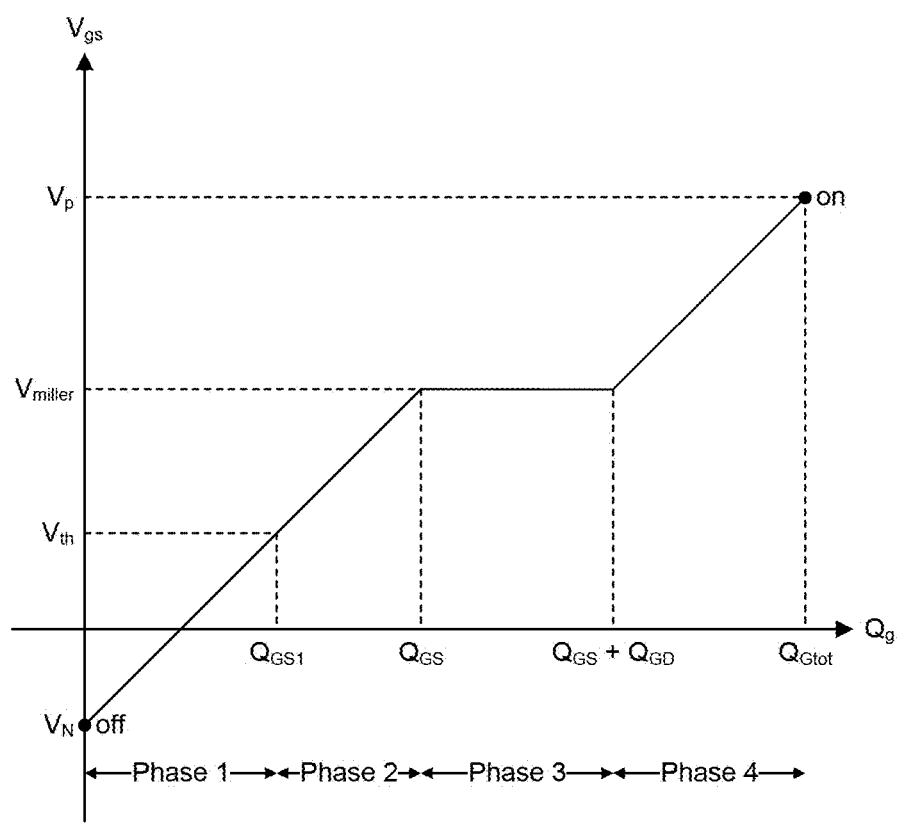
FIG. 1c shows an exemplary gate-charge curve of a power MOSFET illustrating transitions between on and off states in four phases.

The transition dynamics of power MOSFET 102 may be understood in the context of FIG. 1b in view of FIG. 1c. FIG. 1c shows an exemplary gate-charge curve of power MOSFET 102 illustrating transitions between on and off states in four phases. Transitions from off to on or vice versa are associated with a change in gate charge by a defined amount $Q_{Gtot}$. A gate drive circuit may deliver $Q_{Gtot}$ for a transition between states to occur. For example, going from a gate-to-source charge of zero to $Q_{Gtot}$ may cause power MOSFET 102 to transition from an off state to an on state. A charge change in the opposite direction may cause power MOSFET 102 to transition from an on state to an off state. A state transition of power MOSFET 102, therefore, is based on the gate current. The direction of the state transition may be based on the direction of the gate current, and the speed of the switching transition may be based on the instantaneous value of the gate current.

A gate-charge curve may have four distinguishable phases. As shown in FIG. 1c, in phase 1 gate-to-source voltage $V_{gs}$ transitions from an off voltage $V_N$, which for MOSFETs is typically 0 V, to the threshold voltage $V_{th}$. Such a transition may happen after $Q_{GS1}$ charge is transferred to the gate of power MOSFET 102. Once gate-to-source voltage $V_{gs}$ reaches threshold voltage $V_{th}$, switching current $I_{SW}$ starts flowing through the channel of power MOSFET 102. In phase 2, as gate-to-source voltage continues to increase, current $I_{SW}$ flowing through the load path of power MOSFET 102 continues to increase until gate-to-source voltage $V_{gs}$ reaches miller plateau voltage $V_{miller}$. When gate-to-source voltage $V_{gs}$ reaches miller plateau voltage $V_{miller}$, current $I_{SW}$ may be equal to input current $I_{in}$. In phase 3, as charge continues to be transferred to the gate of power MOSFET 102, drain voltage $V_D$ begins to decrease while gate-to-source voltage $V_{gs}$ remains at miller plateau voltage $V_{miller}$. The duration of phase 3 is also known as switching transient time $t_{SW}$. In phase 4, once drain voltage $V_D$ transient has finished, gate-to-source voltage $V_{gs}$ continues to increase until it reaches drive voltage $V_p$. Drive voltage $V_p$ may determine the on-resistance $R_{DSon}$ during the on time of power MOSFET 102. A similar behavior is displayed during a transition from an off state to an on state.

Figure 1D:
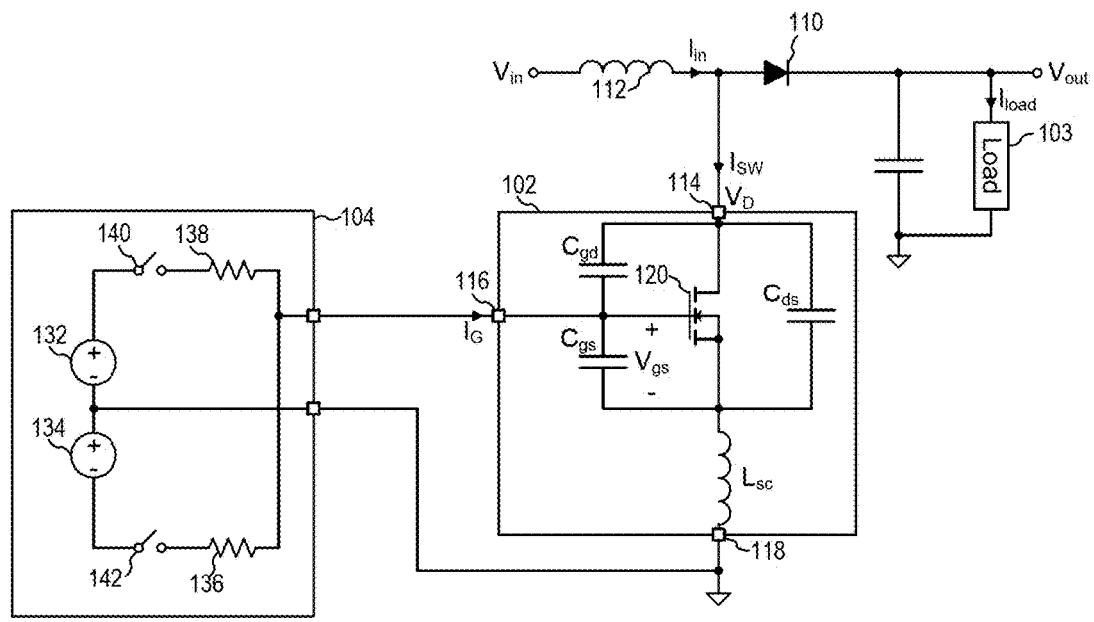
FIG. 1d shows the system of FIG. 1a with a conventional gate drive circuit.

Several gate drive circuit techniques have been used to optimize switching performance. FIG. 1d shows the system of FIG. 1b with a conventional gate drive circuit, including voltage sources 132 and 134, resistors 136 and 138, and switches 140 and 142. The power MOSFET system of FIG. 1d may minimize parasitic inductances between driver and MOSFET gate while using the gate resistances 138 and 136, respectively, to limit the gate current.

During normal operation, switch 142 may be closed and switch 140 may be opened to allow voltage source 134 to apply a voltage to the gate of power MOSFET 102 to keep power MOSFET 102 off. To transition power MOSFET 102 from an off state to an on state, switch 142 may be opened and switch 140 may be closed to allow voltage source 132 to apply a voltage to the gate of power MOSFET 102 to keep power MOSFET 102 on. The descriptions that follow relate to power MOSFET 102 transitioning from an off state to an on state. A similar behavior applies to power MOSFET 102 transitioning from the on state to the off state.

A typical approach for optimizing switching performance is to minimize the output resistance of power source 132 (not shown), minimize parasitic gate loop inductance, and add resistor 138 to control the gate current during state transitions of power MOSFET 102. During phase 1 of a transition from an off state to an on state of power MOSFET 102, switching current $I_{SW}$ is zero, and gate current $I_G$ is given by $$I_G = \frac{V_{132} - V_{gs}}{R_{138}} \quad (1)$$

where $V_2$ represents the voltage of source 132, and $R_{138}$ represents the resistance of resistor 138.

During phases 2 and 3 of a transition from an off state to an on state of power MOSFET 102, switching current $I_{SW}$ through the channel of power MOSFET 102 and through parasitic common source inductance $L_{sc}$ increases from 0 to a peak value $I_P$. Parasitic common source inductance $L_{sc}$ is included in the gate drive loop and since $$\frac{dI_{SW}}{dt} > 0,$$

the voltage drop $V_{LSC}$ across parasitic common source inductance L may be given by $$V_{LSC} = L_{SC} \cdot \frac{dI_{SW}}{dt},$$

which may reduce the effective gate drive voltage. Gate current $I_G$, therefore, may be given by $$I_G = \frac{V_{132} - V_{gs} - V_{LSC}}{R_{138}} \quad (2)$$

Due to the effect of $V_{LSC}$, the instantaneous gate current may be strongly time dependent and may become even negative when $V_{LSC}+V_{gs}>V_{132}$.

Switching transient time $t_{SW}$ is given by $$t_{SW} = \frac{Q_{GD}}{I_{Gavg}} \quad (3)$$

where $Q_{GD}$ is the amount of charge required to move from the beginning of phase 3 to the end of phase 3, and $I_{Gavg}$ is the average gate current exhibited during the transition from the beginning of phase 3 to the end of phase 3. Lower $t_{sw}$, i. e. faster switching, may result in lower switching losses.

There may be a tradeoff, however, between switching speed and voltage overshoot. Typically, a minimum switching transient time $t_{sw,min}$, or equivalently, a maximum allowed average gate current $I_{Gavg,max}$ is enforced in a particular system. To do so, resistance $R_{138}$ may be chosen by $$R_{138} \geq \frac{V_{132} - V_{miller}}{I_{Gavg,max}} = (V_{132} - V_{miller}) \cdot \frac{t_{sw,min}}{Q_{GD}} \quad (4)$$

Equation 4 may not be valid in systems with high $V_{LSC}$ and/or high current systems. In such systems, the instantaneous gate current $I_G$ may be small or even negative, depending on $V_{LSC}$, as shown in Equation 2. A smaller gate current $I_G$ may result in larger switching transient time $t_{SW}$, which may increase the switching losses.

Figure 2:
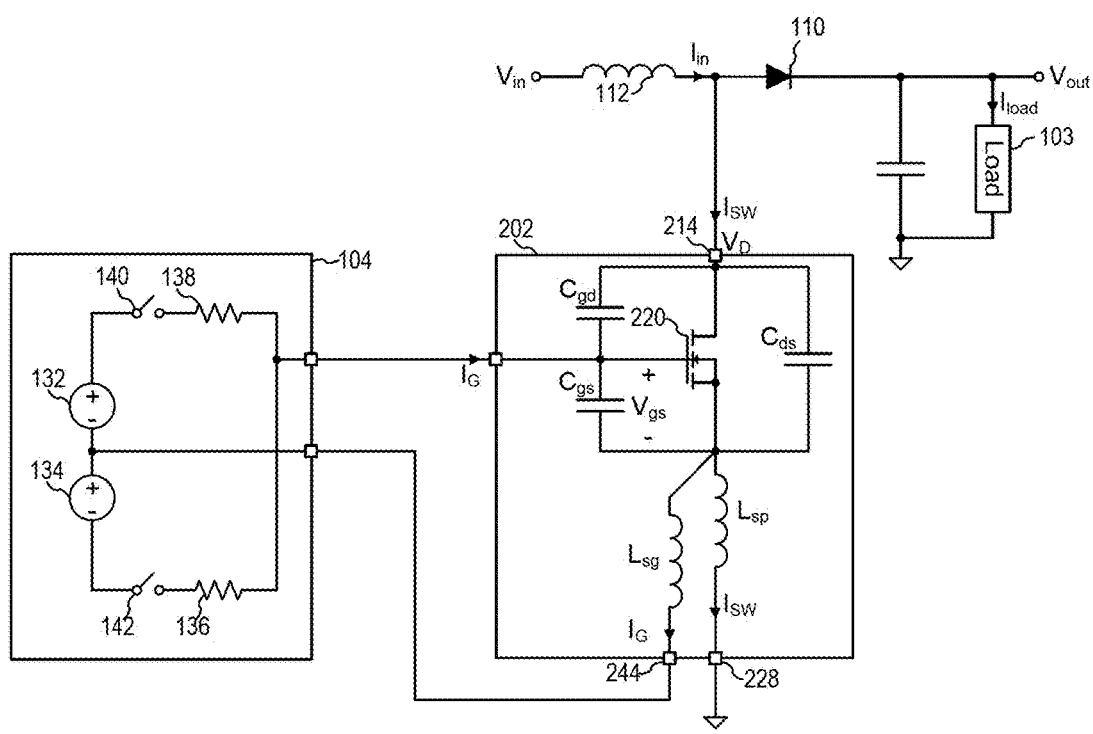
FIG. 2 shows a system with a conventional gate drive circuit and a 4-pin power MOSFET.

The limitations of the system depicted in FIGS. 1b and 1d may be addressed by using power switches in 4-pin packages. FIG. 2 shows a system with a conventional gate drive circuit and a 4-pin power MOSFET. The system of FIG. 2 behaves in a similar manner as the system of FIGS. 1b and 1d. However, by applying the gate drive voltage through a kelvin connection in terminal 244 that bypasses parasitic source inductance $L_{sp}$, the limitations introduced by $V_{LSC}$ may be bypassed by separating the current paths for switching current $I_{sw}$ and gate current $I_G$. As shown in FIG. 2, the reference voltage of gate driver circuit 104 may be given by the voltage at terminal 244. During switching transients, the reference voltage of gate driver circuit 104 may move with respect to a system ground such as the system ground connected to terminal 228. Such variation may include in some cases tens of volts. In such cases, appropriate isolation between input and output of gate driver circuit 104 may be used.

In various embodiments, a gate drive circuit coupled to a conventional 3-pin power MOSFET is configured to minimize the time spent during phases 2 and 3 of a switching transition of a power MOSFET by activating an inductive path during phases 1, 2 and 3 of a power MOSFET transition. The current stored in the inductance during phase 1 may be utilized to provide the gate charge during phases 2 and 3, respectively. The gate drive circuit may be configured to activate a resistive path during phase 4 of the power MOSFET transition, which may reduce or minimize a gate voltage overshoot. The value of inductance in the circuit path of the gate, together with the value of resistance of the high resistance path, may be configured to optimize switching speed and minimize overshoot.

FIGS. 3a-3h show 3-pin power MOSFET system 300 according to an embodiment of the present invention. The 3-pin power MOSFET system 300 includes a gate drive circuit and a 3-pin power MOSFET in a boost configuration.

Figure 3A:
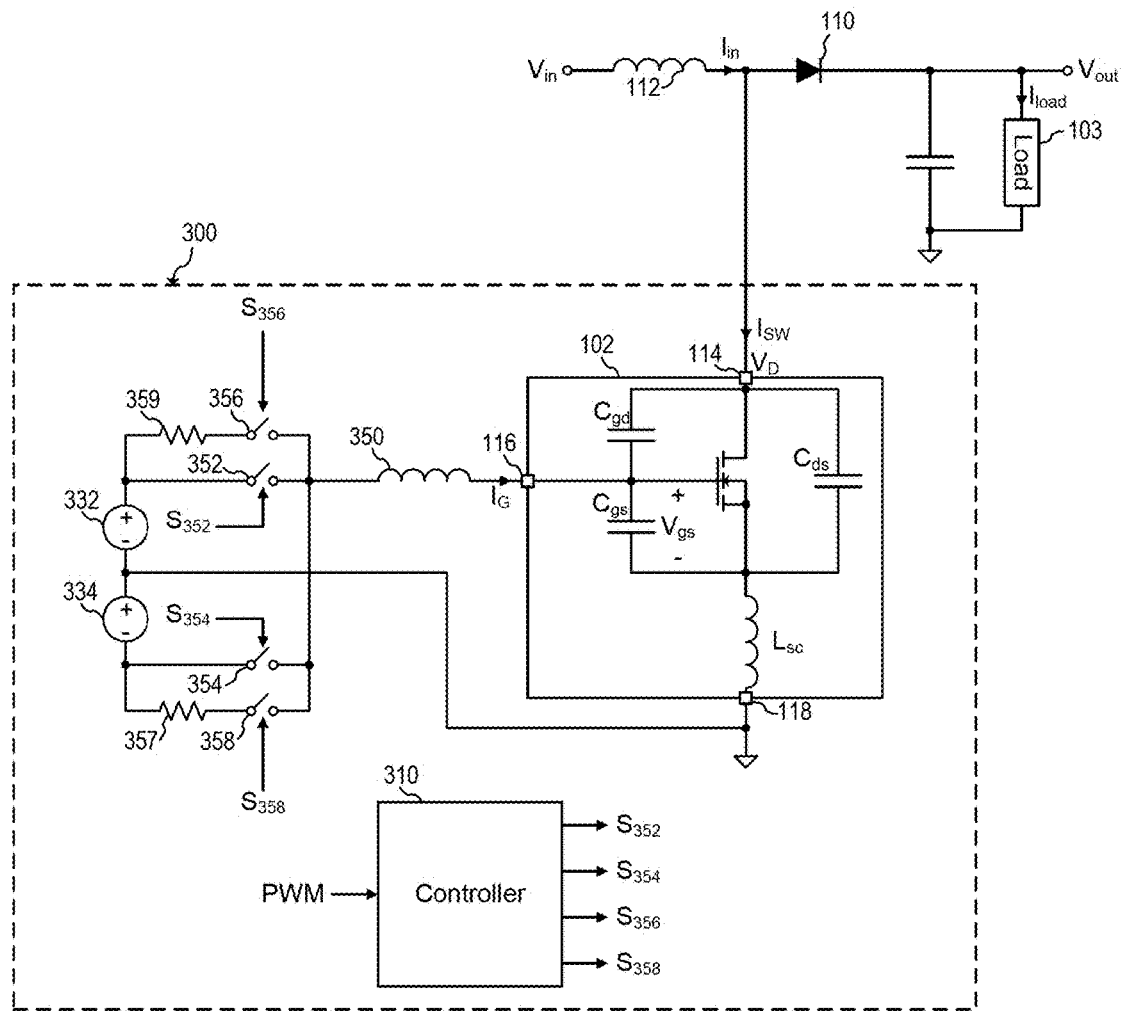
FIG. 3a shows a high level circuit schematic of a 3-pin power MOSFET system, according to an embodiment of the present invention.

FIG. 3a shows a high level circuit schematic of 3-pin power MOSFET system 300, according to an embodiment of the present invention. The 3-pin power MOSFET system 300 includes power MOSFET 102, gate inductor 350, voltage sources 332 and 334, resistors 357 and 359, switches 352, 354, 356, and 358, and controller 310. FIG. 3a shows 3-pin power MOSFET system 300 in a boost configuration. The 3-pin power MOSFET system 300, however, may be implemented in other circuit topologies.

During normal operation, power MOSFET 102 is turned on and off, causing switching current $I_{SW}$ to alternately flow through and be blocked by power MOSFET 102. The descriptions that follow relate to power MOSFET 102 transitioning from an off state to an on state. A similar behavior applies to power MOSFET 102 transitioning from the on state to the off state.

During phases 1, 2 and 3 of a transition from an off state to an on state of power MOSFET 102, switch 352 is closed, and switches 354 and 358 are open. Switch 356 may be open or closed during phases 1, 2 and 3. During phase 1, switching current $I_{SW}$ is zero, and gate current $I_G$ is increasing according to $$\frac{dI_G}{dt} = \frac{V_{332} - V_{gs}}{L_{350}} \quad (5)$$

where $V_{332}$ represents the voltage of voltage source 332, and $L_{350}$, represents the inductance of inductor 350.

During phases 2 and 3 of a transition from an off state to an on state of power MOSFET 102, switching current $I_{SW}$ flows through the load path of power MOSFET 102 and through parasitic common source inductance $L_{sc}$. Since $I_{sw}$ increases starting from zero, $$\frac{dI_{SW}}{dt} > 0,$$

and the voltage drop across parasitic common source inductance $L_{sc}$ causes a decrease in gate current according to $$\frac{dI_G}{dt} = \frac{V_{132} - V_{gs} - V_{LSC}}{L_{350}} \qquad (6)$$

where $V_{LSC}$ is the voltage across parasitic common source inductance $L_{sc}$. In this case, a large $V_{LSC}$ may cause a reduction in gate current $I_G$. However, since inductor 350 reduces the rate of change of gate current $I_G$, gate current $I_G$ may stay positive even for large $V_{LSC}$.

The value of inductor 350 may be chosen by $$L_{350} = \frac{2 \cdot Q_{GS1} \cdot R_{138}^2}{V_{332} - V_{th}} \qquad (7)$$

where $Q_{GS1}$ is the gate charge at the start of phase 2, and $R_{138}$ is the minimum gate resistor according to Equation 4. If inductor 350 is chosen according to Equation 7, the gate current at the beginning of phase 2 may be equal for the inductive drive using inductor 350 and the resistive drive scheme using resistance $R_{138}$.

During phase 4, of a transition from an off state to an on state of power MOSFET 102, switch 356 is closed, and switches 352, 354 and 358 are open. Having resistor 359 in series with inductor 350 during phase 4 may reduce or prevent an overshoot or oscillations.

Power MOSFET 102 may be a normally-off, n-type transistor. In embodiments of the present invention, power MOSFET 102 may be implemented using transistors of the n-type or p-type, normally-on or normally-off transistors, and high voltage transistors or low voltage transistors, including, but not limited to MOSFETs, power MOSFETs, junction field effect transistor (JFETs), HEMT such as gallium nitride (GaN) high electron mobility transistor (HEMT), and insulated gate bipolar transistors (IGBTs). Alternatively, other transistor types may be used. The selection of which transistor to use may be made according to the specifications, voltage levels and current requirements of the particular system being designed. Appropriate adjustments to the circuit may be made to accommodate the particular device type. Power MOSFET 102 may be inside an integrated circuit or, alternatively, may be a component external to an integrated circuit.

Switches 352, 354, 356, and 358 may include transistors of the p-type and n-type. Alternatively, switches 352, 354, 356, and 358 may be implemented with any other switch implementations known in the art. The parasitic resistance associated with switches 352, 354, 356, and 358 and their respective circuit paths are typically below 500 mΩ, and may be, for example, 100 mΩ including the on-resistance of the respective switch. Resistors 357 and 359 may be in the range of a few ohms, and may be, for example, 2Ω. Switches 352, 354, 356, and 358, and resistors 357 and 359 may be inside an integrated circuit or, alternatively, may be implemented discretely.

Resistor 359 may be combined with switches 352 and 356, and may be realized with one single resistive switch. The single resistive switch may control the resistance of its load path to achieve a low resistance state, such as fully on, an open state, such as fully off, and a higher resistance state, such as by operating a transistor in the saturated (current limited) region. Similarly switches 354, and 358, and resistors 357 may be combined into a single resistive switch. Alternatively, switches 352, 354, 356, and 358 and resistors 357 and 359 may be realized with constant current sources.

Inductor 350 may be a physical inductor, may be created with on-chip inductive elements such as metal spirals formed in the chip's metallization layers and/or by layout techniques in a PCB or silicon, and/or may use the parasitic inductance of the circuit. Inductor 350 may be inside an integrated circuit or, alternatively, may be a component external to an integrated circuit.

Controller 310 may receive a switching signal and may control the state of switches 352, 354, 356, and 358 with signals $S_{352}$, $S_{354}$, $S_{356}$, and $S_{358}$ respectively based on the received switching signal. The switching signal may be a PWM, PFM, PDM, or any other type of signal known in the art. Controller 310 may be an off-the shelf micro-controller, such as an MSP430 or ARM core, a custom micro-controller, a processor, a custom state machine, or any other controller implementation known in the art. Controller 310 may be inside an integrated circuit or, alternatively, may be a component external to an integrated circuit.

Figure 3B:
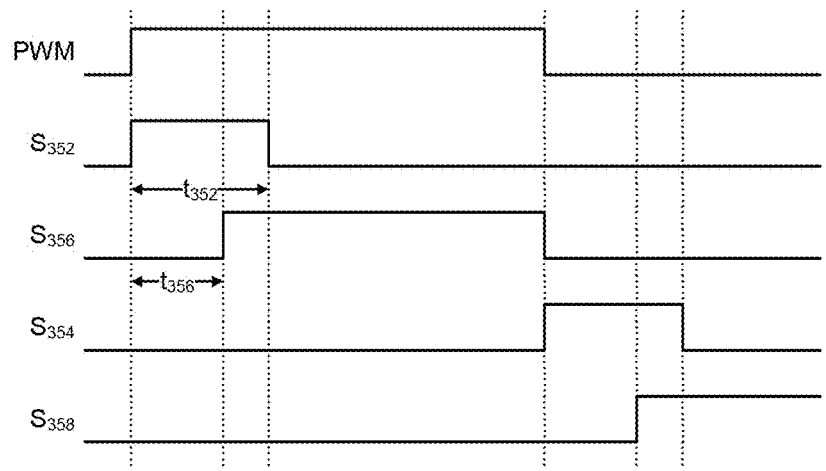
FIG. 3b shows a timing diagram illustrating the state of the gate drive circuit switches with respect to an input switching signal, according to an embodiment of the present invention.

FIG. 3b shows a timing diagram illustrating the state of the gate drive circuit switches with respect to an input switching signal, according to an embodiment of the present invention. The following discussions relate to an input switching signal of the PWM type, but the technique may be adapted to other switching signals known in the art.

When the PWM signal transitions from a first state to a second state, such as low to high, controller 310 turns on switch 352 and turns off switches 354 and 358, which activates an impedance path dominated by the inductance of inductor 350 between power source and the gate of power MOSFET 102. This path is active during phases 1, 2, and 3 of the transition between an off state to an on state of power MOSFET 102. Switch 352 is opened $t_{352}$ time after switch 352 is closed, which may coincide with the end of phase 3. Time $t_{352}$ may be greater than the time of phases 1, 2 and 3, but, to avoid oscillations, may be less than the resonance period of the resonance tank of inductance $L_{350}$ and capacitance $C_{gs}$. Since the period of time from the beginning of phase 1 to the end of phase 3 is related to the charge transfer requirement and the average current, time $t_{356}$ may be selected such that $$\frac{Q_{GS} + Q_{GD}}{I_{Gavg1-3,min}} \le t_{352} \le \sqrt{L_{350} \cdot C_{gs}} \qquad (8)$$

where $I_{Gavg1-3,min}$ is the minimum average gate current during phases 1, 2 and 3.

Switch 356 is closed $t_{356}$ time after switch 352 is closed but before switch 352 is opened. Closing switch 356 while switch 352 is closed may not have a substantial impact on the performance of the system since the resistive path of switch 356 is in parallel with the low resistive path of switch 352. Therefore, time $t_{356}$ may be zero, or a number greater than zero. The relationship between time $t_{352}$ and time $t_{356}$ may be given by $$0 \le t_{356} \le t_{352} \qquad (9)$$

Switch 356 may open when the PWM signal transitions from high to low. At that time, switch 354 closes to enable a low resistive path from power sources 334 to the gate of power MOSFET 102, initiating the transition from the on state to the off state of power MOSFET 102. A similar sequence follows for this transition.

Various embodiments may achieve fast switching transitions and low switching losses by increasing the gate inductance and minimizing the gate resistance. When the switching transition is finished, the gate resonance circuit, which may include the gate inductance and the gate-to-source capacitance, may be damped by switching the gate driver to a higher output resistance, which may avoid gate voltage overshoots.

Figure 3C:
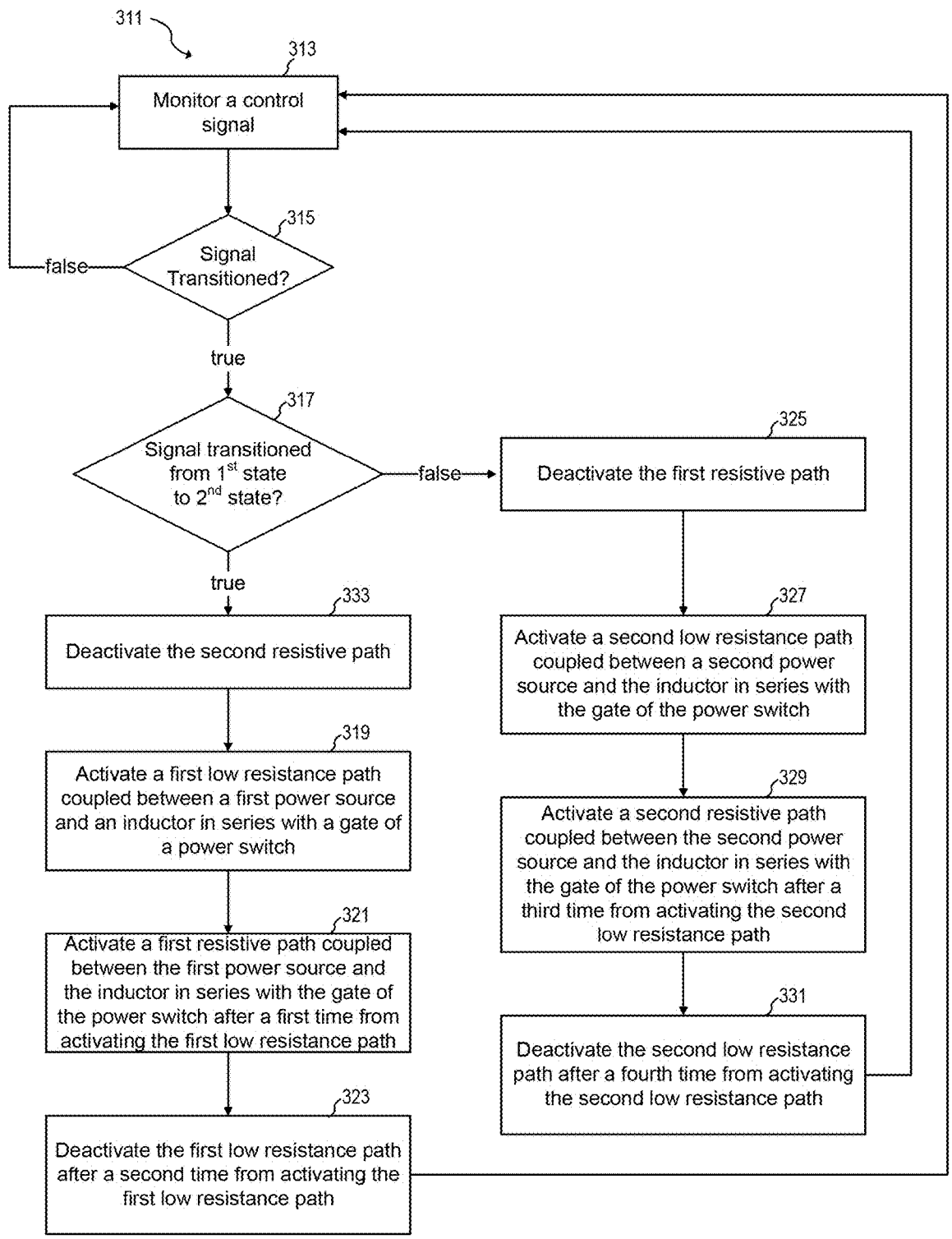
FIG. 3c illustrates a flow chart of an embodiment method for switching a power switch from a first state to a second state.

FIG. 3c illustrates a flow chart of embodiment method 311 for switching a power switch from a first state to a second state. Method 311 may be implemented in 3-pin power MOSFET system 300, but it may also be implemented in other circuit architectures and in other ways known in the art. The discussion that follows assumes that 3-pin power MOSFET system 300, as shown in FIGS. 3a and 3b implement method 311 for switching a power switch.

Step 313 monitors a control signal, which may be an input PWM signal. Step 315 checks whether the control signal has made a transition. If the control signal has not made a transition, step 313 continues to monitor the control signal. If the control signal has made a transition, step 317 checks from which state to which state the transition has occurred. If the transition was from a first state to a second state, then step 333 deactivates a second resistive path, step 319 activates a first low resistance path coupled between a first power source and an inductor in series with a gate of a power switch, step 321 activates a first resistive path coupled between the first power source and the inductor in series with the gate of the power switch after a first time from activating the first low resistance path, and step 323 deactivates the first low resistance path after a second time from activating the first low resistance path and returns to step 313. Otherwise, if the transition was from the second state to the first state, then step 325 deactivates the first resistive path, step 327 activates a second low resistance path coupled between a second power source and the inductor in series with the gate of the power switch, step 329 activates a second resistive path coupled between the second power source and the inductor in series with the gate of the power switch after a third time from activating the second low resistance path, and step 331 deactivates the second low resistance path after a fourth time from activating the second low resistance path and returns to step 313. The first time, second time, third time and fourth time may fulfill conditions given by Equations 8 and 9. Steps 321 may occur at the same time as step 319. Similarly, step 329 may occur at the same time as step 327.

Figure 3D:
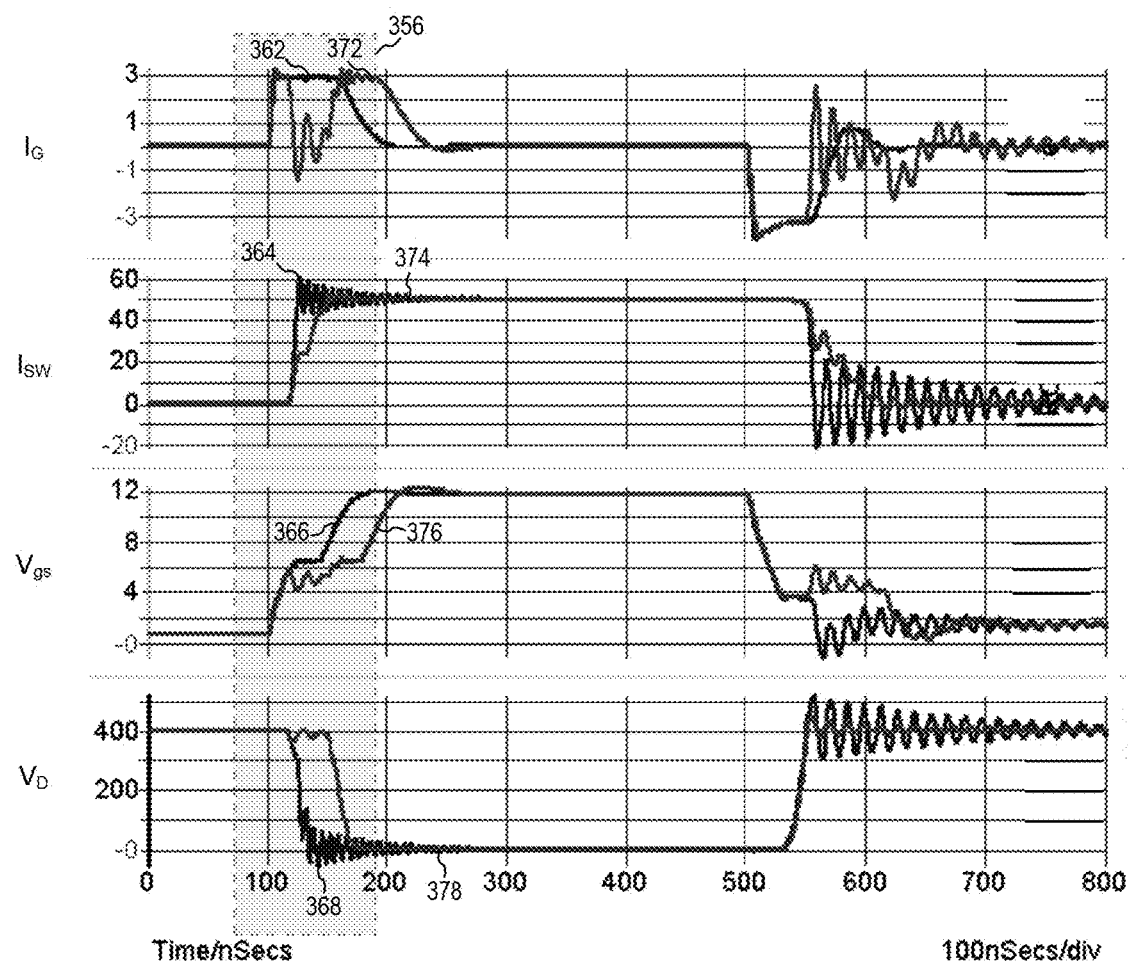
FIGS. 3d-3h illustrate simulation results of a hard-switched boost converter, according to embodiments of the present invention.
Figure 3E:
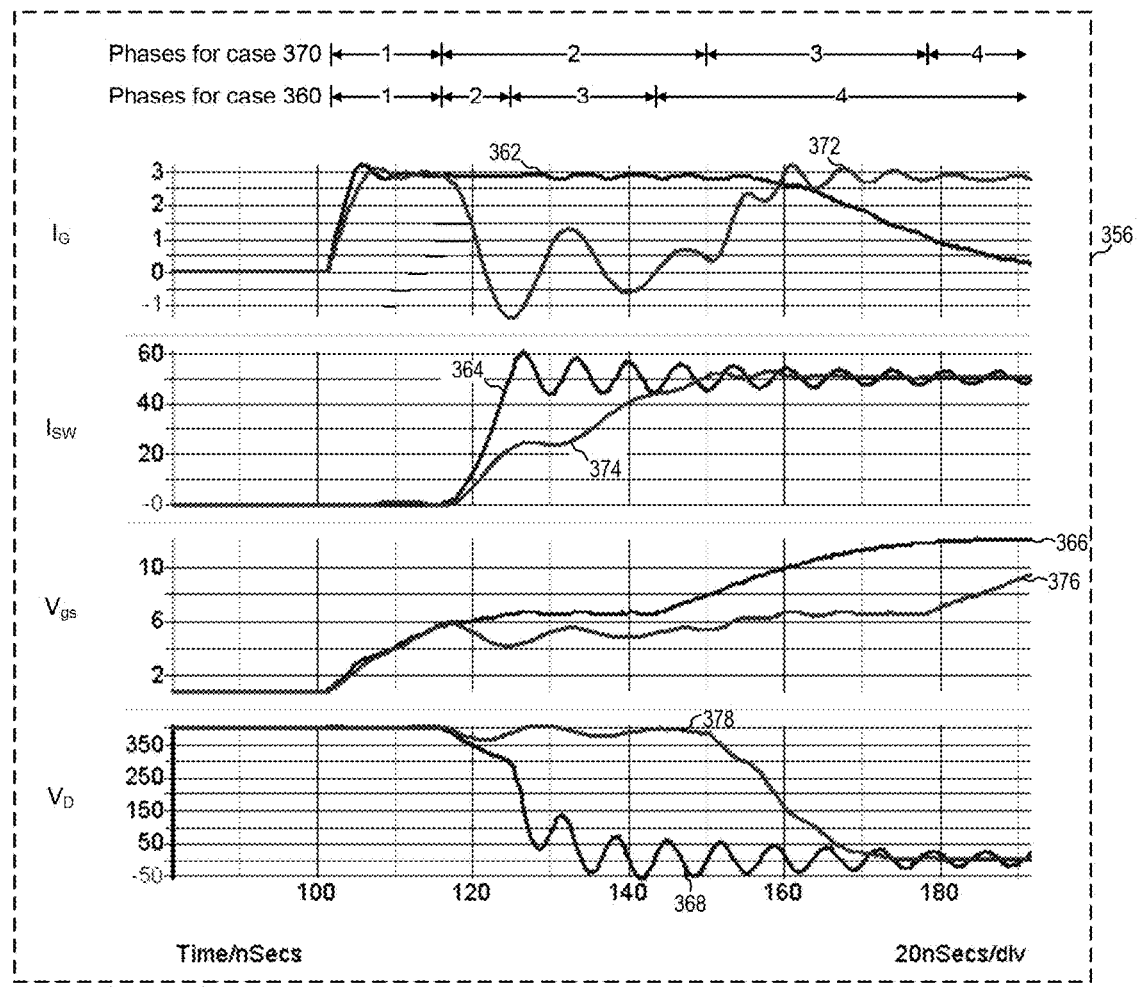

FIGS. 3d-3h illustrate simulation results of a hard-switched boost converter, according to embodiments of the present invention. FIGS. 3d and 3e illustrate a comparison between the switching behavior of negligible source inductance topology 360 and topology with significant common source inductance 370. Topology 360 represents a topology with negligible source inductance, such as the 4-pin topology shown in FIG. 2. Negligible source inductance topology 360 has a $Q_{GD}$ of 70 nC, and $Q_{Gtot}$ of 200 nC, with a driving voltage $V_p$ of 12 V, and an off voltage $V_N$ of 0 V. Power MOSFET 202 is a 600 V switch with an on-resistance of 19 mΩ. Boost converter input current $I_{in}$ is 50 A, and gate current $I_G$ is limited by means of a 2□ gate resistor. Topology 370 represents a topology using a 3-pin power MOSFET with the same gate resistor, such as shown in FIG. 1d. The 3-pin topology 370 has a parasitic common source inductance $L_{SC}$ of 5 nH, a $Q_{GD}$ of 70 nC, and $Q_{Gtot}$ of 200 nC, with a driving voltage $V_p$ of 12 V, and an off voltage $V_N$ of 0 V. Power MOSFET 102 is a 600 V switch with an on-resistance of 19 m≠. Boost converter input current $I_{in}$ is 50 A, and gate current $I_G$ is limited by 2□ gate resistor. The simulation of 4-pin topology 360 includes curves 362, 364, 366, and 368. The simulation of 3-pin topology 370 includes curves 372, 374, 376, and 378.

FIG. 3d shows gate current $I_G$, switching current $I_{SW}$, gate-to-source voltage $V_{gs}$ and drain voltage $V_D$ for a transition from an off state to an on state, and back to an off state of a power MOSFET for 4-pin topology 360 and 3-pin topology 370, respectively. As shown in FIG. 3d, switching current is zero when gate-to-source voltage $V_{gs}$ is zero, and drain voltage is around 400 V. As gate current $I_G$ becomes positive, gate-to-source voltage $V_{gs}$ increases, allowing switching current $I_{SW}$ to increase to about 50 A, and making drain voltage decrease to near zero volts. To transition back to the off state, gate current $I_G$ becomes negative, decreasing gate-to-source voltage $V_{gs}$, causing switching current $I_{SW}$ to decrease to zero, and causing drain voltage to increase back to 400 V.

Section 356 of FIG. 3d shows gate current $I_G$, switching current $I_{SW}$, gate-to-source voltage $V_{gs}$ and drain voltage $V_D$ during phases 1-4 of a transition from the off state to the on state of a power switch operated in 4-pin topology 360 and 3-pin topology 370. FIG. 3e shows a zoomed-in graph of section 356 illustrating the phase transitions for topology 360 and topology 370.

For 4-pin topology 360, during phase 1, gate current $I_G$ increases from 0 A to 3 A, as shown by curve 362. Gate-to-source voltage $V_{gs}$ starts increasing until reaching $V_{th}$, as shown by curve 366. During phase 2, switching current $I_{SW}$ increases from 0 A to around 50 A, as shown by curve 364. At this time, gate-to-source voltage $V_{gs}$ plateaus at the miller voltage $V_{miller}$. Phase 3 begins when switching current $I_{SW}$ reaches input current $I_{in}$. At this time, drain voltage $V_D$ decreases, as shown by curve 368. During phase 4, gate-to-source voltage $V_{gs}$ increase from the miller voltage $V_{miller}$ to about 12 V, as shown by curve 366. Gate current $I_G$ decreases from 3 A to 0 A, as shown by curve 362.

For 3-pin topology 370, during phase 1, gate current $I_G$ increases from 0 A to 3 A, as shown by curve 372. Gate-to-source voltage $V_{gs}$ starts increasing until reaching $V_{th}$, as shown by curve 376. The duration of phase 1 of topology 370 is substantially similar to the duration of phase 1 of topology 360. During phase 2, switching current $I_{SW}$ increases from 0 A to 50 A, as shown by curve 374. As switching current $I_{SW}$ increases, the voltage drop generated by the rate of change of switching current $I_{SW}$ across parasitic common source inductance $L_{SC}$ causes gate current to decrease and turn negative, reaching currents below −1 A, as shown by curve 372. Such decrease in gate current $I_G$ causes phase 2 of topology 370 to last substantially longer than phase 2 of topology 360. Phase 3 begins when switching current $I_{SW}$ reaches input current $I_{in}$. At this time, gate current $I_G$ begins to recover, until it reaches 3 A, as shown in curve 372. The average gate current during phase 3 of topology 370, however, is lower than the average gate current during phase 3 of topology 360. Phase 3 of topology 370, therefore, also lasts longer than phase 3 of topology 360. During phase 4, gate-to-source voltage $V_{gs}$ increase from the miller voltage $V_{miller}$ to about 12 V, as shown by curve 376.

Figure 3F:
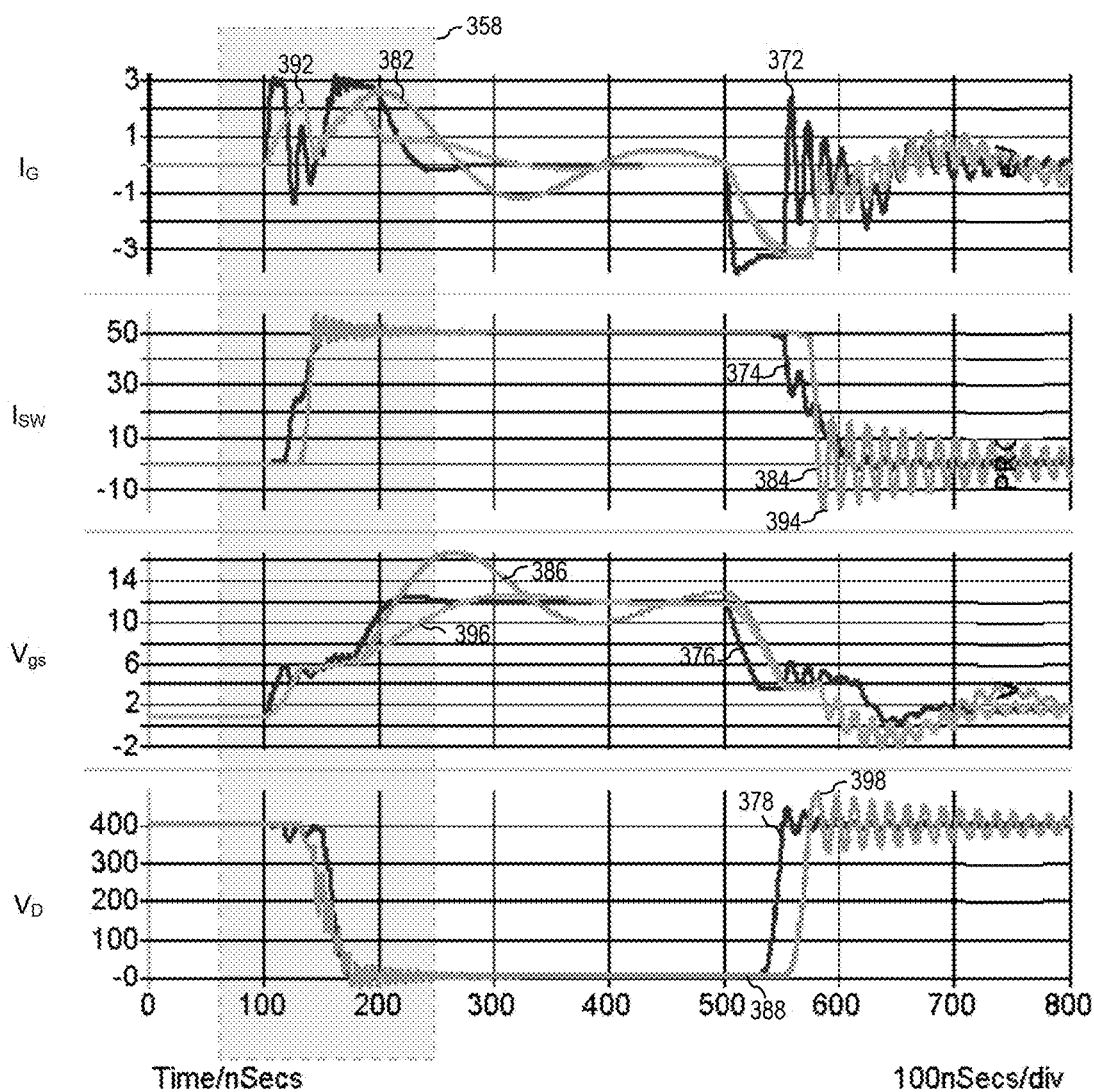
Figure 3G:
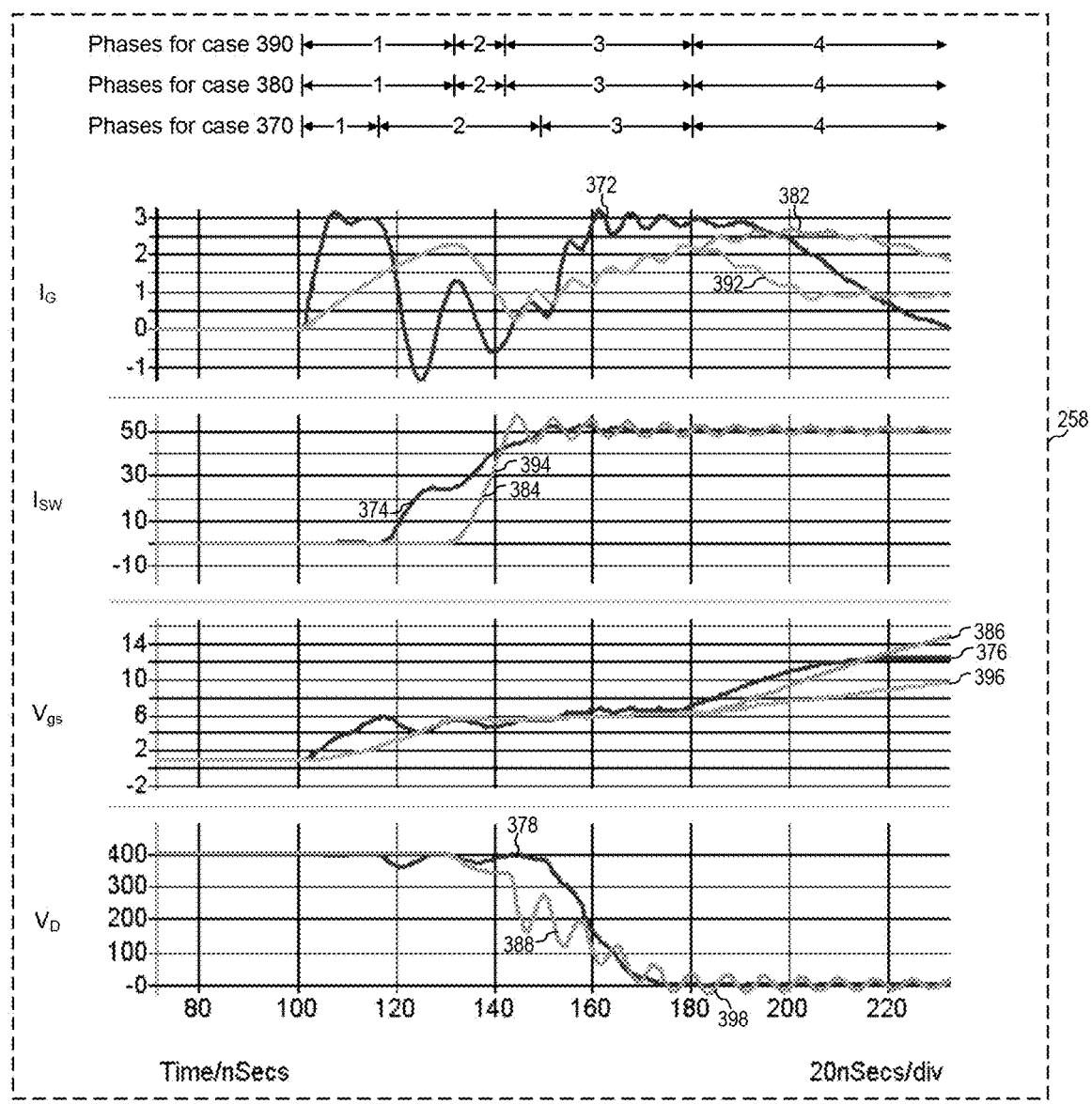

FIGS. 3f and 3g illustrate a comparison between the switching behavior of a switch with significant common source inductance with resistive gate drive topology 370, inductive gate drive topology 380, and damped inductive gate drive topology 390. Inductive gate drive topology 380 represents a topology using a 3-pin power MOSFET using an inductance to control the gate current, such as shown in FIG. 3a. Inductive topology 380 has a parasitic common source inductance $L_{SC}$ of 5 nH, a gate inductor 350 having an inductance of 100 nH, $Q_{GD}$ of 70 nC, and $Q_{Gtot}$ of 200 nC, with a driving voltage $V_p$ of 12 V, and an off voltage $V_N$ of 0 V. Power MOSFET 102 is a 6000 V switch with an on-resistance of 19 mΩ. Input current $I_{in}$ is 50 A, and gate current $I_G$ is limited to a maximum of 3 A. Alternatively, other currents could have been used. Damped inductive topology 390 represents a topology similar to that of inductive topology 380. Damped inductive topology 390, however, limits the gate current during phase 4 to 1 A instead of 3 A. The simulation of inductive topology 380 includes curves 382, 384, 386, and 388. The simulation of damped inductive topology 390 includes curves 392, 394, 396, and 398.

FIG. 3f shows gate current $I_G$, switching current $I_{SW}$, gate-to-source voltage $V_{gs}$ and drain voltage $V_D$ for a transition from an off state to an on state, and back to an off state of a power MOSFET for resistive topology 370, inductive topology 380, and damped inductive topology 390. Section 358 of FIG. 3f shows gate current $I_G$, switching current $I_{SW}$, gate-to-source voltage $V_{gs}$ and drain voltage $V_D$ during phases 1-4 of a transition from the off state to the on state of a power switch for topologies 370, 380, and 390. FIG. 3g shows a zoomed-in graph of section 358 illustrating the phase transitions for resistive topology 370, inductive topology 380, and damped inductive topology 390.

For inductive topology 380, during phase 1, gate current $I_G$ increases from 0 A to 3 A, as shown by curve 382. Gate current $I_G$ of inductive topology 380, however, increases slower than gate current $I_G$ of resistive topology 370, in part, due to the increased inductance in the circuit path driving the gate of the power MOSFET. Such slower increase in gate current $I_G$ causes phase 1 of inductive topology 380 to last longer than phase 1 of resistive topology 370. Such longer duration of phase 1 may cause a delay of the switching transition, but may not have an impact in switching losses or on the switching time. During phase 2, switching current $I_{SW}$ increases from 0 A to around 50 A, as shown by curve 384. As switching current $I_{SW}$ increases, the voltage drop generated by the rate of change of switching current $I_{SW}$ across parasitic common source inductance $L_{SC}$ causes gate current to decrease. The decrease of gate current $I_G$ of inductive topology 380, however, is smaller than the decrease of gate current $I_G$ of resistive topology 370, as shown by curve 382. Gate current $I_G$ of inductive topology 380 may not become negative, in part, because of the increased inductance in the circuit path driving the gate of the power MOSFET. The duration of phase 2 of inductive topology 380, therefore, may be substantially shorter than the duration of phase 2 of resistive topology 370. Phase 3 begins when switching current $I_{SW}$ reaches input current $I_{in}$. At this time, gate current $I_G$ begins to recover, until it reaches 3 A, as shown in curve 372. The average gate current during phase 3 of inductive topology 380, however, may be lower than the average gate current during phase 3 of resistive topology 370. Phase 3 of inductive topology 380, therefore, may last longer than phase 3 of resistive topology 370. However, the duration of phases 2 plus 3 of inductive topology 380 may be shorter than the duration of phases 2 plus 3 of resistive topology 370. As in both phases 2 and 3 power is dissipated due to simultaneous nonzero switch voltage and current, inductive topology 380 may dissipate less switching energy during the switching transient than resistive topology 370. During phase 4, gate-to-source voltage $V_{gs}$ increase from the miller voltage $V_{miller}$ to about 12 V, as shown by curve 386.

Due to resonance, however, gate-to-source voltage V, may overshoot to over 16 V, as shown by curve 386 of FIG. 3f.

Damped inductive topology 390 behaves in a similar manner than inductive topology 380 during the phases 1, 2 and 3. During phase 4, however, a current limit, of for example, 1 A, may be imposed on gate current $I_G$. Such current limit may be implemented with a resistor in series with inductor 350, a current source with a current limit, or any other way known in the art. Limiting the gate current $I_G$ to 1 A during phase 4, reduces the gate-to-source $V_{gs}$ voltage overshoot and may even eliminate it, as shown by curve 396 of FIG. 3f.

Figure 3H:
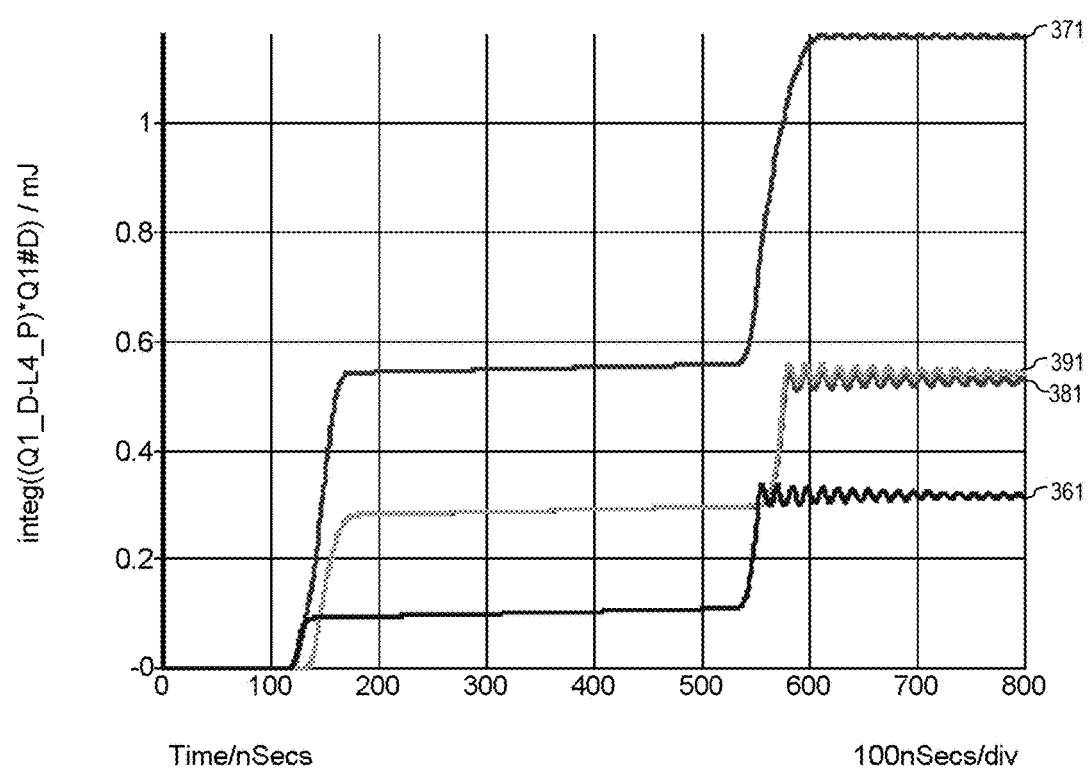

FIG. 3h shows energy consumption versus time of negligible source inductance topology 360, resistive topology 370, inductive topology 380, and damped inductive topology 390 during a switching cycle, such as shown in the waveforms of FIGS. 3d-3g. Curves 361, 371, 381, and 391 represent the energy consumption of 4-pin topology 360, resistive 3-pin topology 370, inductive 3-pin topology 380, and damped inductive 3-pin topology 390, respectively. As shown in FIG. 3h, resistive topology 370 may exhibit energy losses that may be up to three times the energy losses of negligible source inductance topology 360. Inductive topology 380 and damped inductive topology 390 may exhibit energy losses that may be about 50% of the losses exhibited by resistive topology 370. There may not be substantial difference between the energy losses of inductive topology 380 and damped inductive topology 390.

Figure 4:
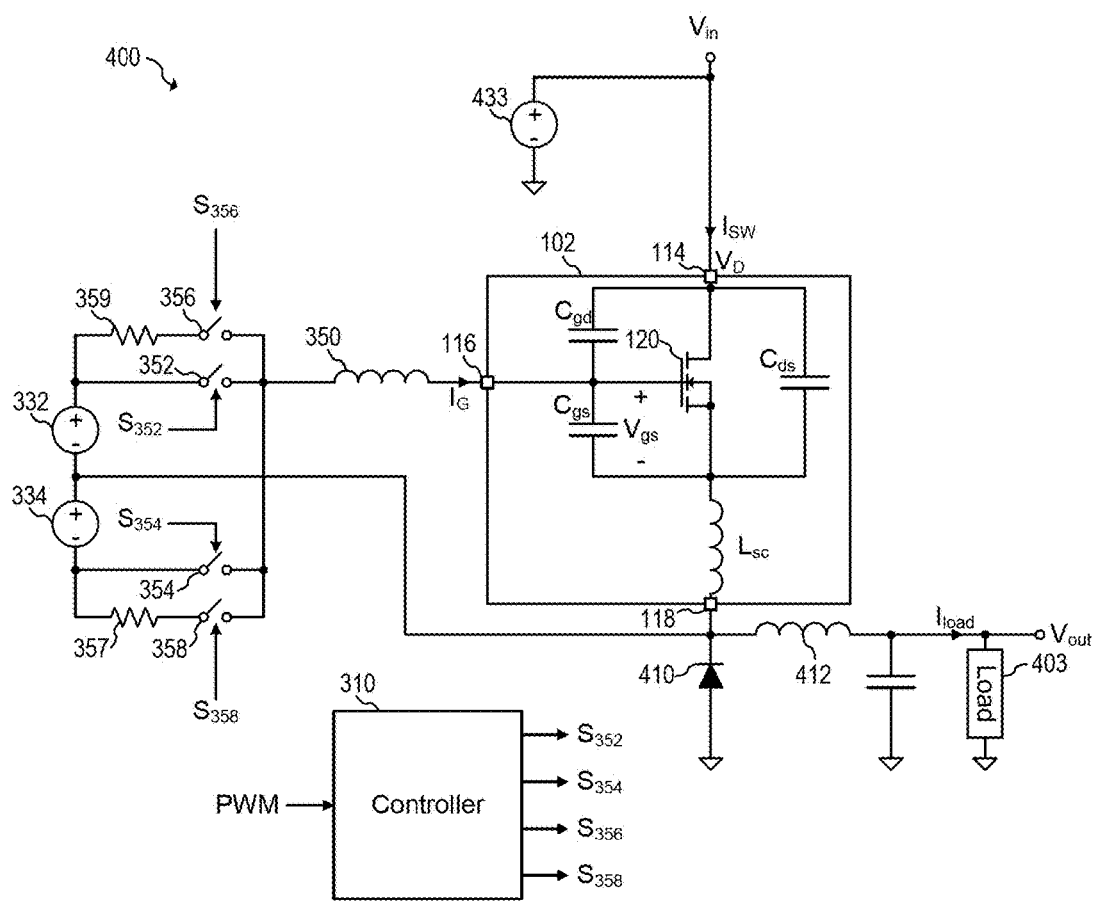
FIG. 4 shows a high level circuit schematic of a 3-pin power MOSFET system in a buck configuration, according to an embodiment of the present invention.

Embodiments of the present invention may be implemented in various topologies. For example, FIG. 4 shows a high level circuit schematic of 3-pin power MOSFET system 400 in a buck configuration, according to an embodiment of the present invention. The 3-pin power MOSFET system 400 includes power MOSFET 102, load 403, inductor 412, diode 410, inductance 3 50 power sources 332 and 334, resistors 357 and 359, switches 352, 354, 356, and 358, and controller 310.

The 3-pin power MOSFET system 400 may operate in a similar manner as 3-pin power MOSFET system 300, and may implement method 311 for switching a power switch. 3-pin power MOSFET system 400, however, implements a buck topology instead of a boost topology. During normal operation, power MOSFET 102 is turned on and off, causing load current $I_{load}$ to alternately flow through a load path of the power MOSFET 102 and diode 410. Despite the difference in topologies, the gate drive circuit and gate drive circuit methodology may be identical to that of 3-pin power MOSFET system 300. Other converter topologies may be implemented with a similar gate drive circuit, such as buck-boost, fly-back, and forward converters.

Figure 5:
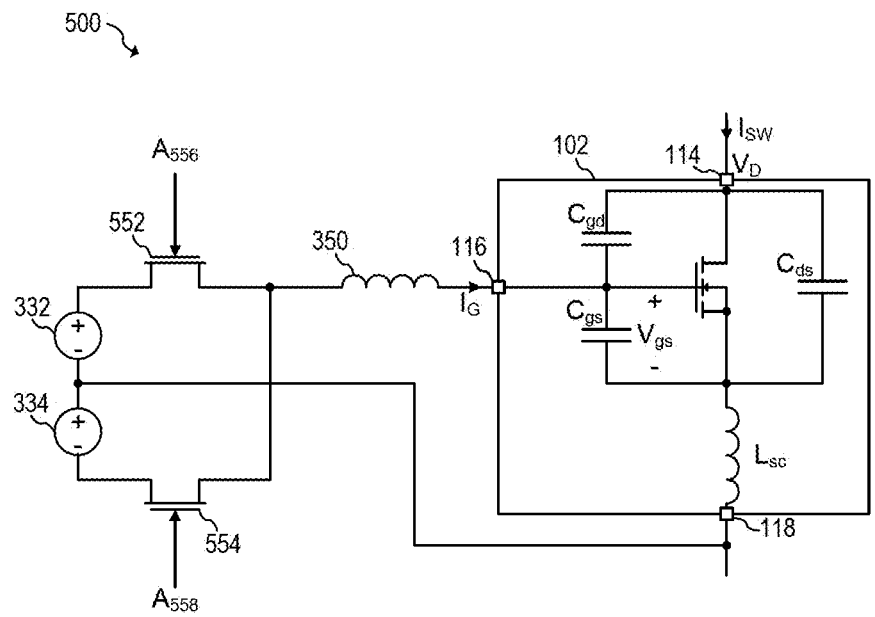
FIG. 5 shows an alternative implementation of the 3-pin power MOSFET system, according to an embodiment of the present invention.
Figure 5:
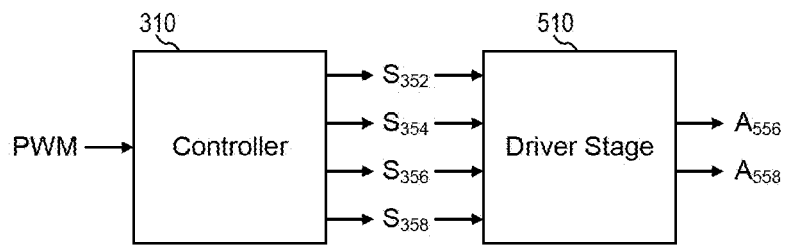

Embodiments of the present invention may be implemented in alternative ways. For example, FIG. 5 shows an alternative implementation of 3-pin power MOSFET system 500, according to an embodiment of the present invention. The 3-pin power MOSFET system 500 includes power MOSFET 102, inductance 350 power sources 332 and 334, transistors 552 and 554, driver stage 510, and controller 310.

The 3-pin power MOSFET system 500 may operate in a similar manner as the gate drive portion of 3-pin power MOSFET systems 300 and 400, and may implement method 311 for switching a power switch. The 3-pin power MOSFET 500, however, employs transistors 552 and 554 instead of resistors 357 and 359, and switches 352, 354, 356, and 358. For example, when signal $S_{352}$ is high, and signals $S_{354}$ and $S_{358}$ are low, driver stage 510 generates signals $A_{556}$ and $A_{558}$ such that transistor 554 is open and transistor 552 is fully on. When signal $S_{356}$ is high, and signals $S_{352}$, $S_{554}$ and $S_{358}$ are low, driver stage 510 generates signals $A_{556}$ and $A_{558}$ such that transistor 554 is open and transistor 552 is resistively on. Similarly, when signal $S_{354}$ is high, and signals $S_{352}$ and $S_{356}$ are low, driver stage 510 generates signals $A_{556}$ and $A_{558}$ such that transistor 552 is open and transistor 554 is fully on. When signal $S_{358}$ is high, and signals $S_{352}$, $S_{554}$ and $S_{356}$ are low, driver stage 510 generates signals $A_{556}$ and $A_{558}$ such that transistor 552 is open and transistor 554 is resistively on.

Analog driver 510 may be implemented in any way known in the art, and may be integrated inside controller 310. Transistors 552 and 554 may be, for example, MOS transistors of the p-type or n-type. Other transistor technologies may be used.

One general aspect includes a circuit including: a gate driver coupled to a first supply terminal and to an output terminal, the output terminal configured to be coupled to a gate of a switching transistor via an inductive element, the gate driver configured to receive a switching signal; provide a first gate activation voltage at the output terminal with a first output resistance when the switching signal transitions from a first state to a second state; provide the first gate activation voltage at the output terminal with a second output resistance after a first time of providing the first gate activation voltage at the output terminal with the first output resistance, the second output resistance being larger than the first output resistance; and provide a first gate deactivation voltage at the output terminal when the switching signal transitions from the second state to the first state.

Implementations may include one or more of the following features. The circuit where the first time is longer than a time from providing the first gate activation voltage at the output terminal with the first output resistance until a drain voltage of the switching transistor begins to transition as a result of the first gate activation voltage. The circuit where the first time is shorter than a transition time of the switching transistor, where the transition time of the switching transistor includes phases 1, 2, 3 and 4 of a switching transition. The circuit where the gate driver includes a first switch coupled to the first supply terminal and to the output terminal, providing the first gate activation voltage at the output terminal with the first output resistance includes closing the first switch, providing the first gate activation voltage at the output terminal with the second output resistance includes increasing a resistance of a load path of the first switch, and providing the first gate deactivation voltage includes opening the first switch. The circuit where the first switch includes a transistor. The circuit further including a controller coupled to the first switch, the controller configured to close the first switch, increase the resistance of the load path of the first switch, and open the first switch. The circuit where the gate driver is further coupled to a second supply terminal, the gate driver further configured to provide a second gate activation voltage at the output terminal with a third output resistance when the switching signal transitions from the second state to the first state, provide the second gate activation voltage at the output terminal with a fourth output resistance after a second time of providing the second gate activation voltage at the output terminal with the third output resistance, the fourth output resistance being larger than the third output resistance, and provide a second gate deactivation voltage at the output terminal when the switching signal transitions from the first state to the second state. The circuit where the gate driver includes a first switch coupled to the first supply terminal and to the output terminal, and a second switch coupled to the second supply terminal and to the output terminal, providing the first gate activation voltage at the output terminal with the first output resistance includes closing the first switch, providing the first gate activation voltage at the output terminal with the second output resistance includes increasing a resistance of a load path of the first switch, and providing the first gate deactivation voltage includes opening the first switch, providing the second gate activation voltage at the output terminal with the third output resistance includes closing the second switch, providing the second gate activation voltage at the output terminal with the fourth output resistance includes increasing a resistance of a load path of the second switch, and providing the second gate deactivation voltage includes opening the second switch. The circuit further including a controller coupled to the first switch and to the second switch, the controller configured to close the first switch, increase the resistance of the load path of the first switch, and open the first switch, close the second switch, increase the resistance of the load path of the second switch, and open the second switch. The circuit where the controller increases the resistance of the load path of the first switch after the first time of closing the first switch. The circuit where the first time is shorter than a resonance period of a resonance tank formed between an inductance in series with the output terminal and an equivalent capacitance at the output terminal. The circuit where the gate driver includes: a first switch coupled to the first supply terminal and to the output terminal; a second switch coupled to the first supply terminal and to the output terminal; and a first resistive element in series with the second switch, where the circuit further includes a controller coupled to the first switch and to the second switch, the controller configured to close the first switch when providing the first gate activation voltage at the output terminal with the first output resistance, close the second switch and open the first switch when providing the first gate activation voltage at the output terminal with the second output resistance, and open the first switch and the second switch when providing the first gate deactivation voltage at the output terminal. The circuit where the first resistive element includes a first resistor. The circuit where the first resistive element includes a first transistor. The circuit where the first switch and the second switch are closed simultaneously. The circuit where the switching signal includes a PWM signal. The circuit further including a first power supply coupled to the first supply terminal and to a second supply terminal, the second supply terminal configured to be coupled to a source of the switching transistor. The circuit further including the switching transistor. The circuit where the switching transistor includes an n-type power MOSFET. The circuit further including the inductive element. The circuit where the inductive element includes an inductor. The circuit where the inductive element includes PCB traces. The circuit where the inductive element includes on-chip inductive elements.

Another general aspect includes a method of controlling a power MOSFET including: receiving a switching signal, turning on a first low resistance path coupled between a first power supply and a gate of the power MOSFET when the switching signal transitions from a first state to a second state, turning on a first resistive path coupled between the first power supply and the gate of the power MOSFET after a first time from turning on the first low resistance path, turning off the first low resistance path after a second time from turning on the first low resistance path, and turning off the first resistive path when the switching signal transitions from the second state to the first state.

Implementations may include one or more of the following features. The method further including: turning on a second low resistance path coupled between a second power supply and the gate of the power MOSFET when the switching signal transitions from the second state to the first state, turning on a second resistive path coupled between the second power supply and the gate of the power MOSFET after a third time from turning on the second low resistance path, turning off the second low resistance path after a fourth time from turning on the second low resistance path, and turning off the second resistive path when the switching signal transitions from the first state to the second state. The method where the first time is equal to the third time and the second time is equal to the fourth time. The method where the first time is zero. The method where the switching signal includes a PWM signal.

Yet another general aspect includes an integrated circuit including: a first switch coupled to a first supply terminal and to an output terminal, the output terminal configured to be coupled to a gate of a switching transistor via an inductive element; a second switch coupled to the first supply terminal and to the output terminal; a first resistor in series with the second switch; and a controller coupled to the first switch and to the second switch, the controller configured to receive a switching signal, close the first switch when the switching signal transitions from a first state to a second state, close the second switch, open the first switch after a first time from closing the first switch, and open the second switch when the switching signal transitions from the second state to the first state.

Implementations may include one or more of the following features. The integrated circuit where the second switch is closed after closing the first switch. The integrated circuit where the second switch is closed at the same time as closing the first switch. The integrated circuit further including: a third switch coupled to a second supply terminal and to the output terminal; a fourth switch coupled to the second supply terminal and to the output terminal; and a second resistive element in series with the fourth switch, where the controller is further coupled to the third switch and to the fourth switch, the controller further configured to close the third switch when the switching signal transitions from the second state to the first state, close the fourth switch, open the third switch after a second time from closing the third switch, and open the fourth switch when the switching signal transitions from the first state to the second state. The integrated circuit further including a power supply coupled to the first supply terminal and to a source of the switching transistor. The integrated circuit further including the inductive element.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a gate driver coupled to a first supply terminal and to an output terminal, the output terminal configured to be coupled to a gate of a switching transistor via an inductive element, the gate driver configured to
   receive a switching signal;
   provide a first gate activation voltage at the output terminal with a first output resistance when the switching signal transitions from a first state to a second state;
   provide the first gate activation voltage at the output terminal with a second output resistance after a first time of providing the first gate activation voltage at the output terminal with the first output resistance, the second output resistance being larger than the first output resistance; and
   provide a first gate deactivation voltage at the output terminal when the switching signal transitions from the second state to the first state.

2. The circuit of claim 1, wherein the first time is longer than a time from providing the first gate activation voltage at the output terminal with the first output resistance until a drain voltage of the switching transistor begins to transition as a result of the first gate activation voltage.

3. The circuit of claim 2, wherein the first time is shorter than a transition time of the switching transistor, wherein the transition time of the switching transistor comprises phases 1, 2, 3 and 4 of a switching transition.

4. The circuit of claim 1, wherein
   the gate driver comprises a first switch coupled to the first supply terminal and to the output terminal,
   providing the first gate activation voltage at the output terminal with the first output resistance comprises closing the first switch,
   providing the first gate activation voltage at the output terminal with the second output resistance comprises increasing a resistance of a load path of the first switch, and
   providing the first gate deactivation voltage comprises opening the first switch.

5. The circuit of claim 4, wherein the first switch comprises a transistor.

6. The circuit of claim 4, further comprising a controller coupled to the first switch, the controller configured to
   close the first switch,
   increase the resistance of the load path of the first switch, and
   open the first switch.

7. The circuit of claim 1, wherein the gate driver is further coupled to a second supply terminal, the gate driver further configured to
   provide a second gate activation voltage at the output terminal with a third output resistance when the switching signal transitions from the second state to the first state,
   provide the second gate activation voltage at the output terminal with a fourth output resistance after a second time of providing the second gate activation voltage at the output terminal with the third output resistance, the fourth output resistance being larger than the third output resistance, and
   provide a second gate deactivation voltage at the output terminal when the switching signal transitions from the first state to the second state.

8. The circuit of claim 7, wherein
   the gate driver comprises
     a first switch coupled to the first supply terminal and to the output terminal, and
     a second switch coupled to the second supply terminal and to the output terminal,
   providing the first gate activation voltage at the output terminal with the first output resistance comprises closing the first switch,
   providing the first gate activation voltage at the output terminal with the second output resistance comprises increasing a resistance of a load path of the first switch, and providing the first gate deactivation voltage comprises opening the first switch,
providing the second gate activation voltage at the output terminal with the third output resistance comprises closing the second switch,
providing the second gate activation voltage at the output terminal with the fourth output resistance comprises increasing a resistance of a load path of the second switch, and
providing the second gate deactivation voltage comprises opening the second switch.

9. The circuit of claim 8, further comprising a controller coupled to the first switch and to the second switch, the controller configured to
close the first switch,
increase the resistance of the load path of the first switch, and
open the first switch,
close the second switch,
increase the resistance of the load path of the second switch, and
open the second switch.

10. The circuit of claim 9, wherein the controller increases the resistance of the load path of the first switch after the first time of closing the first switch.

11. The circuit of claim 1, wherein the first time is shorter than a resonance period of a resonance tank formed between an inductance in series with the output terminal and an equivalent capacitance at the output terminal.

12. The circuit of claim 1, wherein the gate driver comprises:
a first switch coupled to the first supply terminal and to the output terminal;
a second switch coupled to the first supply terminal and to the output terminal; and
a first resistive element in series with the second switch, wherein the circuit further comprises a controller coupled to the first switch and to the second switch, the controller configured to
close the first switch when providing the first gate activation voltage at the output terminal with the first output resistance,
close the second switch and open the first switch when providing the first gate activation voltage at the output terminal with the second output resistance, and
open the first switch and the second switch when providing the first gate deactivation voltage at the output terminal.

13. The circuit of claim 12, wherein the first resistive element comprises a first resistor.

14. The circuit of claim 12, wherein the first resistive element comprises a first transistor.

15. The circuit of claim 12, wherein the first switch and the second switch are closed simultaneously.

16. The circuit of claim 1, wherein the switching signal comprises a PWM signal.

17. The circuit of claim 1, further comprising a first power supply coupled to the first supply terminal and to a second supply terminal, the second supply terminal configured to be coupled to a source of the switching transistor.

18. The circuit of claim 1, further comprising:
the switching transistor; and
the inductive element.

19. A method of controlling a power MOSFET comprising:
receiving a switching signal;
turning on a first low resistance path coupled between a first power supply and a gate of the power MOSFET when the switching signal transitions from a first state to a second state;
turning on a first resistive path coupled between the first power supply and the gate of the power MOSFET after a first time from turning on the first low resistance path;
turning off the first low resistance path after a second time from turning on the first low resistance path; and
turning off the first resistive path when the switching signal transitions from the second state to the first state.

20. The method of claim 19 further comprising:
turning on a second low resistance path coupled between a second power supply and the gate of the power MOSFET when the switching signal transitions from the second state to the first state;
turning on a second resistive path coupled between the second power supply and the gate of the power MOSFET after a third time from turning on the second low resistance path;
turning off the second low resistance path after a fourth time from turning on the second low resistance path; and
turning off the second resistive path when the switching signal transitions from the first state to the second state.

21. The method of claim 20, wherein the first time is equal to the third time and the second time is equal to the fourth time.

22. The method of claim 19, wherein the first time is zero.

23. An integrated circuit comprising:
a first switch coupled to a first supply terminal and to an output terminal, the output terminal configured to be coupled to a gate of a switching transistor via an inductive element;
a second switch coupled to the first supply terminal and to the output terminal;
a first resistor in series with the second switch; and
a controller coupled to the first switch and to the second switch, the controller configured to
receive a switching signal,
close the first switch when the switching signal transitions from a first state to a second state,
close the second switch,
open the first switch after a first time from closing the first switch, and
open the second switch when the switching signal transitions from the second state to the first state.

* * * * *